(12) United States Patent
Park et al.

(10) Patent No.: US 10,050,881 B2
(45) Date of Patent: Aug. 14, 2018

(54) METHOD AND APPARATUS FOR TRANSMITTING AND RECEIVING DATA IN COMMUNICATION SYSTEM

(71) Applicant: SAMSUNG ELECTRONICS CO., LTD., Suwon-si, Gyeonggi-do (KR)

(72) Inventors: Kyounghan Park, Suwon-si (KR); SoonHyung Gwon, Seongnam-si (KR); HeeDong Kim, Namyangju-si (KR); JongWoo Lee, Seongnam-si (KR); DongYun Hwang, Seoul (KR); JunHyung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 41 days.

(21) Appl. No.: 15/264,879

(22) Filed: Sep. 14, 2016

(65) Prior Publication Data

US 2017/0085481 A1     Mar. 23, 2017

(30) Foreign Application Priority Data

Sep. 17, 2015   (KR) .................. 10-2015-0131522

(51) Int. Cl.
*H04W 4/70*      (2018.01)
*H04W 4/00*      (2018.01)
*H04L 12/743*    (2013.01)

(52) U.S. Cl.
CPC ......... *H04L 45/7453* (2013.01); *H04W 4/005* (2013.01); *H04W 4/70* (2018.02)

(58) Field of Classification Search
CPC .......................... H04L 45/7453; H04W 4/005
See application file for complete search history.

(56) References Cited

U.S. PATENT DOCUMENTS

| 5,978,791 | A | 11/1999 | Farber et al. |
| 8,677,009 | B2 | 3/2014 | Gavrilov et al. |
| 2006/0056624 | A1 | 3/2006 | Ishiguro et al. |
| 2009/0319547 | A1 | 12/2009 | Hollis |

(Continued)

FOREIGN PATENT DOCUMENTS

JP          5739079       6/2015

OTHER PUBLICATIONS

Search Report and Written Opinion dated Dec. 14, 2016 in counterpart International Patent Application No. PCT/KR2016/010346.

(Continued)

*Primary Examiner* — Ronald B Abelson
(74) *Attorney, Agent, or Firm* — Nixon & Vanderhye P.C.

(57) ABSTRACT

Disclosed is a technology for a sensor network, Machine to Machine (M2M), Machine Type Communication (MTC), and Internet of Things (IoT). The present disclosure can be used for intelligent services (for example, services related to smart homes, smart buildings, smart cities, smart cars, connected cars, health care, digital education, retail businesses, security, and safety) based on the technology. A method of transmitting data in a communication system includes: generating a hash value by applying a hash function to original data; generating a message including at least one of the original data and the generated hash value based on whether there is an existing hash value equal to the generated hash value; and transmitting the message.

28 Claims, 12 Drawing Sheets

(56) References Cited

U.S. PATENT DOCUMENTS

| | | |
|---|---|---|
| 2013/0311671 A1 | 11/2013 | Luo et al. |
| 2014/0122878 A1 | 5/2014 | Cho et al. |
| 2014/0192965 A1* | 7/2014 | Almeida ............... H04M 3/436 379/70 |
| 2014/0223029 A1 | 8/2014 | Bhaskar et al. |
| 2014/0337301 A1 | 11/2014 | Jang et al. |
| 2015/0026567 A1 | 1/2015 | Bots et al. |

OTHER PUBLICATIONS

European Search Report dated Jun. 7, 2018 for EP Application No. 16846879.1.

\* cited by examiner

| Device#1 (810-1) ||
|---|---|
| Before | After |
| A, 100Byte | 20 Byte |
| B, 90Byte | 20 Byte |
| C, 80Byte | 20 Byte |

Data Generate
AAAAABBBBCCCCCCAABBB
A:7, B:7, C:6

100*7 + 90*7 + 80*6 =

| Data Size | 1810 |
|---|---:|
| Transfer Size | 670 |

| Device #2 (810-2) ||
|---|---|
| Before | After |
| E, 100 Byte | 20 Byte |
| F, 90 Byte | 20 Byte |
| G, 80 Byte | 20 Byte |

Data Generate
EEEEFFFFFFFGGGGGFFFFF
E:4, F:11, G:5
100*4 + 90*11 + 80*5

| Data Size | 1790 |
|---|---:|
| Transfer Size | 670 |

| Device #3 (810-3) ||
|---|---|
| Before | After |
| I, 100 Byte | 20 Byte |
| J, 90 Byte | 20 Byte |
| K, 80 Byte | 20 Byte |

Data Generate
IIIIIJJJJJJJJJJKKKKK
I:5, J:10: K:5
100*5 + 90*10 + 80*5

| Data Size | 1800 |
|---|---:|
| Transfer Size | 670 |

| Device #4 (810-4) ||
|---|---|
| Before | After |
| L, 100 Byte | 20 Byte |
| M, 90 Byte | 20 Byte |
| N, 80 Byte | 20 Byte |

Data Generate
LLLMMMMMMMMMMMMNNNNN
L:3, M:12: N:5
100*3 + 90*12 + 80*5

| Data Size | 1780 |
|---|---:|
| Transfer Size | 670 |

FIG.13A

| Device #1 | | Device #2 | | Device #3 | | Device #4 | |
|---|---|---|---|---|---|---|---|
| A | A + H(A) | E | E + H(E) | I | I + H(I) | L | L + H(L) |
| A | H(A) | E | H(E) | I | H(I) | L | H(L) |
| A | H(A) | E | H(E) | I | H(I) | L | H(L) |
| A | H(A) | E | H(E) | I | H(I) | M | M + H(M) |
| A | H(A) | F | F + H(F) | I | H(I) | M | H(M) |
| B | B + H(B) | F | H(F) | J | J + H(J) | M | H(M) |
| B | H(B) | F | H(F) | J | H(J) | M | H(M) |
| B | H(B) | F | H(F) | J | H(J) | M | H(M) |
| C | C + H(C) | F | H(F) | J | H(J) | M | H(M) |
| C | H(C) | G | G + H(G) | J | H(J) | M | H(M) |
| C | H(C) | G | H(G) | J | H(J) | M | H(M) |
| C | H(C) | G | H(G) | J | H(J) | M | H(M) |
| C | H(C) | G | H(G) | J | H(J) | M | H(M) |
| C | H(C) | G | H(G) | J | H(J) | M | H(M) |
| A | H(A) | F | H(F) | K | K + H(H) | N | N + H(N) |
| A | H(A) | F | H(F) | K | K(H) | N | H(N) |
| B | H(B) | F | H(F) | K | K(H) | N | H(N) |
| B | H(B) | F | H(F) | K | K(H) | N | H(N) |
| B | H(B) | F | H(F) | K | K(H) | N | H(N) |

| | Origianl | | | | New |
|---|---|---|---|---|---|
| | Device #1 | Device #2 | Device #3 | Device #4 | |
| | 120 | 120 | 120 | 120 | ○ | 500
| | 20 | 20 | 20 | 20 | ○ | 80
| | 20 | 20 | 20 | 20 | × | 20
| | 20 | 20 | 20 | 110 | ○ | 80
| | 20 | 110 | 20 | 20 | ○ | 170
| | 110 | 20 | 110 | 20 | ○ | 260
| | 20 | 20 | 20 | 20 | ○ | 80
| | 20 | 20 | 20 | 20 | × | 20
| | 20 | 20 | 20 | 20 | × | 20
| | 100 | 20 | 20 | 20 | ○ | 160
| | 20 | 100 | 20 | 20 | ○ | 160
| | 20 | 20 | 20 | 20 | ○ | 80
| | 20 | 20 | 20 | 20 | × | 20
| | 20 | 20 | 20 | 20 | × | 20
| | 20 | 20 | 20 | 20 | × | 20
| | 20 | 20 | 100 | 100 | ○ | 160
| | 20 | 20 | 20 | 20 | ○ | 80
| | 20 | 20 | 20 | 20 | ○ | 80
| | 20 | 20 | 20 | 20 | × | 20
| | 20 | 20 | 20 | 20 | × | 20
| | 670 | 670 | 670 | 670 | | 2050

FIG.13B

METHOD AND APPARATUS FOR TRANSMITTING AND RECEIVING DATA IN COMMUNICATION SYSTEM

CROSS-REFERENCE TO RELATED APPLICATION

This application is based on and claims priority under 3 U.S.C. § 119 to Korean Application Serial No. 10-2015-0131522, which was filed in the Korean Intellectual Property Office on Sep. 17, 2015, the content of which is incorporated by reference herein in its entirety.

TECHNICAL FIELD

The present disclosure relates generally to a method and an apparatus for transmitting and receiving data using a particular function value in a communication system.

BACKGROUND

The Internet is evolving from a human-oriented connection network in which humans generate and consume information, to an Internet of Things (IoT) network in which distributed elements, such as things and the like, exchange and process information. Internet of Everything (IoE) technology may be an example of a combination of IoT technology and big data processing technology through a connection with a cloud server.

In order to implement the IoT, research on technical factors such as sensing techniques, wired/wireless communication and network infrastructure, service interface technology, and security technology is required, and thus technologies such as a sensor network, Machine to Machine (M2M) communication, Machine Type Communication (MTC), and the like for a connection between objects are being developed.

In an IoT environment, through collection and analysis of data generated in connected objects, an intelligent Internet Technology (IT) service to create a new value for the human life may be provided. The IoT may be applied to fields, such as smart homes, smart buildings, smart cities, smart cars, connected cars, smart grids, health care, smart home appliances, or high-tech medical services, through the convergence of the conventional Information Technology (IT) and various industries.

In such an IoT-based communication system, data including similar information is continuously transmitted to a reception entity by a transmission entity. For example, in a communication system, large data such as environment information input into a sensor that measures temperature and humidity and recognition information generated by various devices is generated. Further, characteristics of the environment information correspond to continuous generation of the data including similar information.

However, the reception entity of the communication system analyzes the received data to identify the purpose of data, so that the transmission entity should transmit all the generated data to the reception entity without any omission. As a result, since the transmission entity should transmit the continuously generated large similar data to the reception entity without any omission, costs for the transmission are generated and a transmission channel is wasted. Further, such problems have increased exponentially due to the development of IoT and devices.

In the conventional arts, a transmission entity used a data compression method and a parallel data transmission method to efficiently transmit large data. At this time, when the data compression method is used before or after the transmission entity transmits data, it takes a lot of time to compress or decompress the data. Further, when the transmission entity transmits data in parallel or through a thread, the reception entity may efficiently receive the data, but the problems of transmission costs and transmission channel waste do not improve since the amount of the data transmitted by the transmission entity is not reduced.

Accordingly, the IoT-based communication system requires a method of efficiently transmitting and receiving similar data.

SUMMARY

The present disclosure provides a method and an apparatus for efficiently transmitting and receiving similar data in a communication system.

Further, the present disclosure provides a method and an apparatus for transmitting and receiving data using a particular function value in a communication system.

In accordance with an aspect of the present disclosure, a method of transmitting data in a communication system is provided. The method includes: generating a hash value by applying a hash function to original data; generating a message including at least one of the original data and the generated hash value based on whether there is an existing hash value equal to the generated hash value; and transmitting the message.

In accordance with another aspect of the present disclosure, a method of receiving data in a communication system is provided. The method includes: receiving a message; and identifying original data based on a hash value included in the message.

In accordance with another aspect of the present disclosure, a method of transmitting and receiving data by a gateway in a communication system is provided. The method includes: receiving hash values from a plurality of devices; generating one hash value by applying a hash function to the received hash values; generating a message including at least one of the received hash values and the generated hash value based whether there is an existing hash value equal to the generated hash value; and transmitting the message.

In accordance with another aspect of the present disclosure, an apparatus for transmitting data in a communication system is provided. The apparatus includes: a controller configured to generate a hash value by applying a hash function to original data and to generate a message including at least one of the original data and the generated hash value based on whether there is an existing hash value equal to the generated hash value; and a transmitter that transmits the message.

In accordance with another aspect of the present disclosure, an apparatus for receiving data in a communication system is provided. The apparatus includes: a receiver configured to receive a message; and a controller configured to identify original data based on a hash value included in the message.

In accordance with another aspect of the present disclosure, an apparatus for transmitting and receiving data by a gateway in a communication system is provided. The apparatus includes: a receiver configured to receive hash values from a plurality of devices; a controller configured to generate one hash value by applying a hash function to the received hash values and to generate a message including at least one of the received hash values and the generated hash value based on whether there is an existing hash value equal to the generated hash value; and a transmitter configured to transmit the message.

BRIEF DESCRIPTION OF THE DRAWINGS

The above and other aspects, features, and advantages of the present disclosure will be more apparent from the following detailed description, taken in conjunction with the accompanying drawings, in which like reference numerals refer to like elements, and wherein:

FIGS. 12, 13A and 13B are diagrams illustrating another example of efficiency of data transmission by a transmission entity in a communication system according to an example embodiment of the present disclosure.

DETAILED DESCRIPTION

Hereinafter, an example embodiment of the present disclosure will be described in greater detail with reference to the accompanying drawings. In the following description, it should be noted that only portions required for comprehension of operations according to the example embodiments of the present disclosure will be described and descriptions of other portions may be omitted to avoid obscuring subject matters of the present disclosure.

An example aspect of the present disclosure is to transmit and receive, when the same data is continuously generated in an IoT-based communication system and is transmitted and received, only truly original data information wherein the truly original data can be recognized, without transmitting and receiving repeated original data.

To this end, a method and an apparatus for transmitting and receiving data in a communication system according to an example embodiment of the present disclosure will be described.

Figure 1:
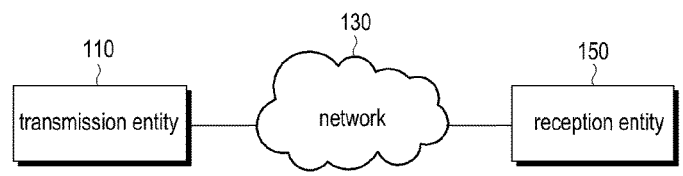
FIG. 1 is a diagram illustrating an example configuration of a communication system according to an example embodiment of the present disclosure.

FIG. 1 is a diagram illustrating an example configuration of a communication system according to an example embodiment of the present disclosure.

Referring to FIG. 1, an IoT-based communication system may include, for example, a transmission entity 110 that transmits data in a hierarchical network environment and a reception entity 150 that receives data, wherein the transmission entity 110 and the reception entity 150 exist, for example, on respective layers. For example, the transmission entity 110 may be, for example, one gateway that connects one device or a plurality of devices, and the reception entity 150 may be, for example, a server.

When original data to be transmitted is generated, the transmission entity 110 identifies whether there is a record of previous transmission of the original data before the generated original data is transmitted to the reception entity 150. For example, the transmission entity 110 generates a function value using a particular function for the original data and identifies whether there is a function value which is the same as the generated function value in a memory. For example, the memory may exist inside or outside the transmission entity 110 and it is assumed that the memory exists inside the transmission entity 110 in the following example embodiments, but the examples are not limited thereto.

Accordingly, the transmission entity 110 may identify whether there is a record of the previous transmission of the original data based on whether the function value is the same as the generated function value that is included in the internal memory. The particular function may correspond, for example, to a function that outputs a value shorter than the length of the original data at a fast processing speed. Hereinafter, example embodiments of the present disclosure describe an example in which the particular function is a hash function, but the example embodiments of the present disclosure can be applied to any functions that output a message length shorter than the message at a fast processing speed.

The transmission entity 110 determines whether to apply the hash function to the original data instead of unconditionally applying the hash function to the original data. For example, when the hash function is unconditionally applied, overhead may be generated due to the hash function, so that the transmission entity 110 may, for example, determine whether to apply the hash function in consideration of the following conditions.

The transmission entity 110 may determine, for example, whether to apply the hash function in consideration of characteristics of the original data. For example, when the length of the original data is shorter than a hash value generated from the hash function, the transmission entity 110 may determine to not apply the hash function since there is no gain in terms of efficiency of data transmission. Further, the transmission entity 110 may determine whether to apply the hash function in consideration of a transmission frequency of the original data. For example, when there is a difference in frequency of generation of the same data in the same device based, for example, on a time, the transmission entity 110 may determine to not apply the hash function. The device having the difference in the frequency of the generation of the same data based on the time may be, for example, a device that measures a heart rate. The device that measures the heart rate has repetitive similar data (that is, heart rate) in daily life, but continuously generates new data during exercise due to a large change in the heart rate. Accordingly, the transmission entity 110 may transmit only the hash value in daily life but should transmit both the new data and the hash value during exercise. Therefore, applying the hash function according to an example embodiment of the present disclosure may be inefficient. As a result, the transmission entity 110 may determine that the hash function will not be applied when there is a large difference in frequency of generation of the same data based on a time, such as, for example, the device that measures the heart rate. In another example, when the transmission entity 110 transmits data detected by a temperature sensor, the transmission entity 110 may determine that the hash function will be applied since the data is relatively constant.

As described above, when it is determined that the hash function will be applied to the original data, the transmission entity 110 determines a type of the hash function to be applied. For example, the transmission entity 110 may determine the type of the hash function based on the characteristics, length, and generation frequency of the original data. The hash function may have different execution speeds, hash value lengths, and collision possibilities according to the type of the function. Accordingly, the transmission entity 110 may, for example, determine the type of hash function in consideration of the following conditions. For example, when the original data is generated more frequently than a predetermined threshold value, the transmission entity 110 may determine to use the hash function that generates a length of the hash value that is shorter than the predetermined threshold value. In another example, when the original data is generated more frequently than a predetermined threshold value, the transmission entity 110 may determine to use the hash function having a collision possibility lower than the predetermined threshold value such as Message Digest (MD)4 and MD5. In another example, when the original data is generated more frequently than a predetermined threshold value, the transmission entity 110 may determine to use the hash function having an execution speed slower than the predetermined threshold value.

Referring back to FIG. 1, when the hash value which is the same as the generated hash value is included in the internal memory, the transmission entity 110 transmits a message that includes only the generated hash value without transmitting the new original data to the reception entity 150 through the network 130 since the original data has been previously transmitted.

On the other hand, when the hash value which is the same as the generated hash value is not included in the internal memory, the transmission entity 110 determines that the new original data has not previously been transmitted, stores the original data and the generated hash value in the internal memory, and transmits a message including both the original data and the generated hash value to the reception entity 150 through the network 130.

Accordingly, when the same data is generated, the transmission entity 110 may reduce a total amount of data transmitted through the network 130 by transmitting only the hash value to the reception entity 150 without transmitting the same data multiple times. For example, the hash function may correspond to a digest function that reduces data having a predetermined length to be data having a certain length on the nature thereof. Accordingly, even though the original data has a length larger than a predetermined threshold value, the transmission entity 110 transmits only a hash value having predetermined bits (for example, 128 bits or 160 bits according to the hash function) based on the hash function, thereby reducing resources used in the whole network.

In FIG. 1, the reception entity 150 receives a message from the transmission entity 110 through the network 130. Further, the reception entity 150 identifies whether a hash value included in the received message is stored in the internal memory. When the hash value is not stored in the internal memory based on a result of the identification, the reception entity 150 stores the original message included in the message and the hash value in the internal memory and may transmit the original data included in the message to another entity or an application. In contrast, when the hash value is stored in the internal memory, the reception entity 150 may extract original data corresponding to the hash value from the internal memory and transmit the extracted original data to another entity or an application.

Figure 2:
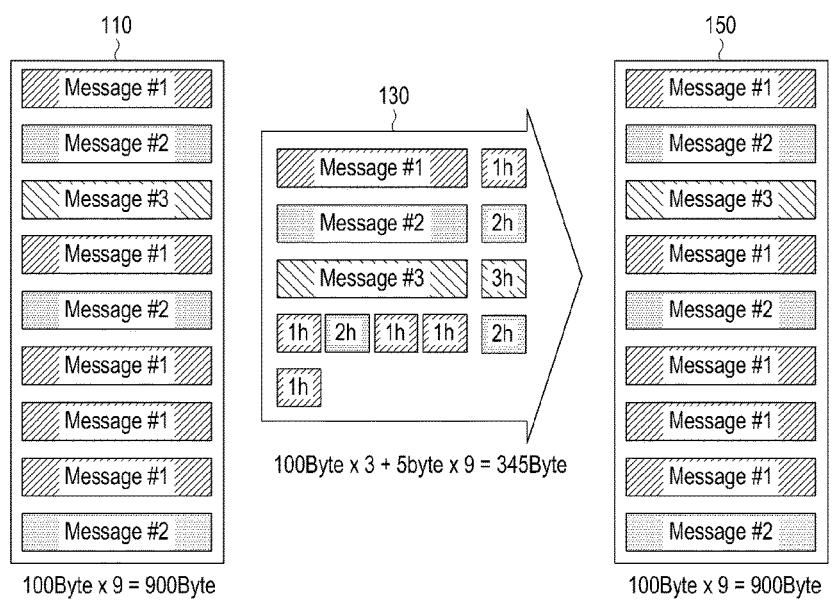
FIG. 2 is a diagram illustrating an example of transmitting and receiving data in a communication system according to an example embodiment of the present disclosure.

In the communication system according to an example embodiment of the present disclosure, data may be transmitted and received through an example illustrated in FIG. 2.

FIG. 2 is a diagram illustrating an example of transmitting and receiving data in a communication system according to an example embodiment of the present disclosure.

Referring to FIG. 2, only when each of first to third messages is initially transmitted, the transmission entity 110 inserts the transmitted original data and a hash value (h) corresponding to the original data into each of the first to third messages and transmits the first to third message to the reception entity 150 through the network 130. Further, when each of the first and second messages is retransmitted, the transmission entity 110 may insert only the hash value corresponding to the original data into each of the first and second messages without inserting the newly generated original data into each of the first and second messages, and transmit the first and second messages to the reception entity 150 through the network 130.

In addition, when the reception entity 150 receives the message including both the original data and the hash value from the transmission entity 150 through the network 130, the reception entity 150 may store the original data and the hash value include in the message in the internal memory. When the reception entity 150 receives the message, which does not include the original data and includes the hash value, through the network 130, the reception entity 150 may extract original data corresponding to the received hash value among a plurality of pieces of original data stored in the internal memory.

Accordingly, when the same data is retransmitted, the transmission entity 110 according to an example embodiment of the present disclosure may transmit a message shorter than the message including the original data, thereby rapidly and efficiently transmitting the message to the reception entity 150. For example, when it is assumed that the message including one original piece of data has a size of 100 bytes, if the transmission entity 110 desires to transmit 9 messages, the conventional transmission entity 110 should transmit a message having a size of 900 bytes. However, the transmission entity 110 according to an example embodiment of the present disclosure transmits the message including the original data only when the original message is initially transmitted, and transmits the message including only the hash value beginning with the second transmission, thereby transmitting a message having a total size of 345 bytes through the network 130. Further, as described above, the reception entity 150 may extract original data by using the hash value included in the received message, and thus identify a message having a size of 900 bytes which is the same as the message which the transmission entity 110 desired to transmit.

Figure 3:
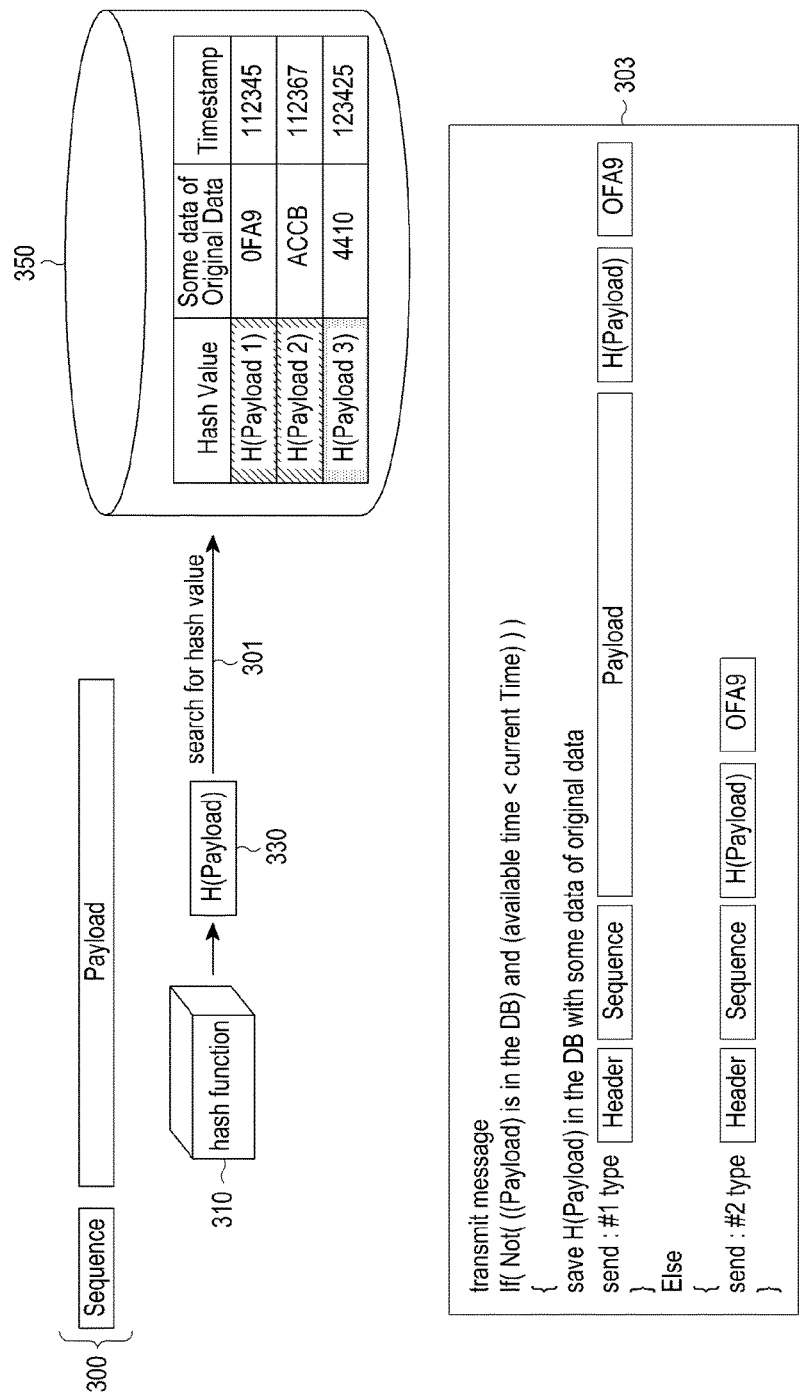
FIG. 3 is a diagram illustrating an example in which a transmission entity of a communication system transmits data according to an example embodiment of the present disclosure.

FIG. 3 is a diagram illustrating an example in which the transmission entity of the communication system transmits data according to an example embodiment of the present disclosure.

Referring to FIG. 3, the transmission entity 110 generates a hash value 330 by applying a hash function 310 to original data 300 including a sequence and a payload. The transmission entity 110 searches for whether there is a hash value which is the same as the generated hash value 330 in an internal memory (that is, a local database) 350. The internal memory 350 may manage at least one of the hash value, some of the original data, and a timestamp of the generated hash value. Some of the original data may be used by the reception entity 150 to identify the original data such as the hash value and, when the original data is identified using both the hash value and some of the original data, accurately identify the original data even when the hash value collides.

Further, the transmission entity 110 transmits another type message to the reception entity 150 based on whether there is the hash value which is the same as the generated hash value in the internal memory 350 as indicted by reference numeral 303. Additionally, the transmission entity 110 may store a timestamp value of an available time of the hash value stored in the internal memory 350 and transmit the other type message to the reception entity 150 in consideration of the timestamp value.

For example, when there is no hash value which is the same as the generated hash value in the internal memory 350 or when a current time value or a count value exceeds the timestamp value of the hash value stored in the internal memory 350 even though there is the hash value which is the same as the generated hash value in the internal memory 350, the transmission entity 110 stores the generated hash value, the original data, some of the original data, and the timestamp value in the internal memory 350. Further, the transmission entity 110 transmits a first type message including the original data and the generated hash value to the reception entity 150. The first type message may include at least one of a header including information on the first type, the sequence and payload of the original data, a payload indicating the generated hash value, and some of the original data.

On the other hand, when there is the hash value which is the same as the generated hash value in the internal memory 350 and the current time value or the count value does not exceed the timestamp value of the hash value stored in the internal memory 350, the transmission entity 110 transmits a second type message including the generated hash value and some of the original data to the reception entity 150. The second type message may include at least one of a header including information on the second type, the sequence of the original data, the generated hash value, and some of the original data.

The reception entity 150 may perform different operations according to the type of message received from the transmission entity 110. Accordingly, an example where the reception entity 150 receives the first type message from the transmission entity 110 is described with reference to FIG. 4, and an example where the reception entity 150 receives the second type message from the transmission entity 110 is described in greater detail below with reference to FIG. 5.

Figure 4:
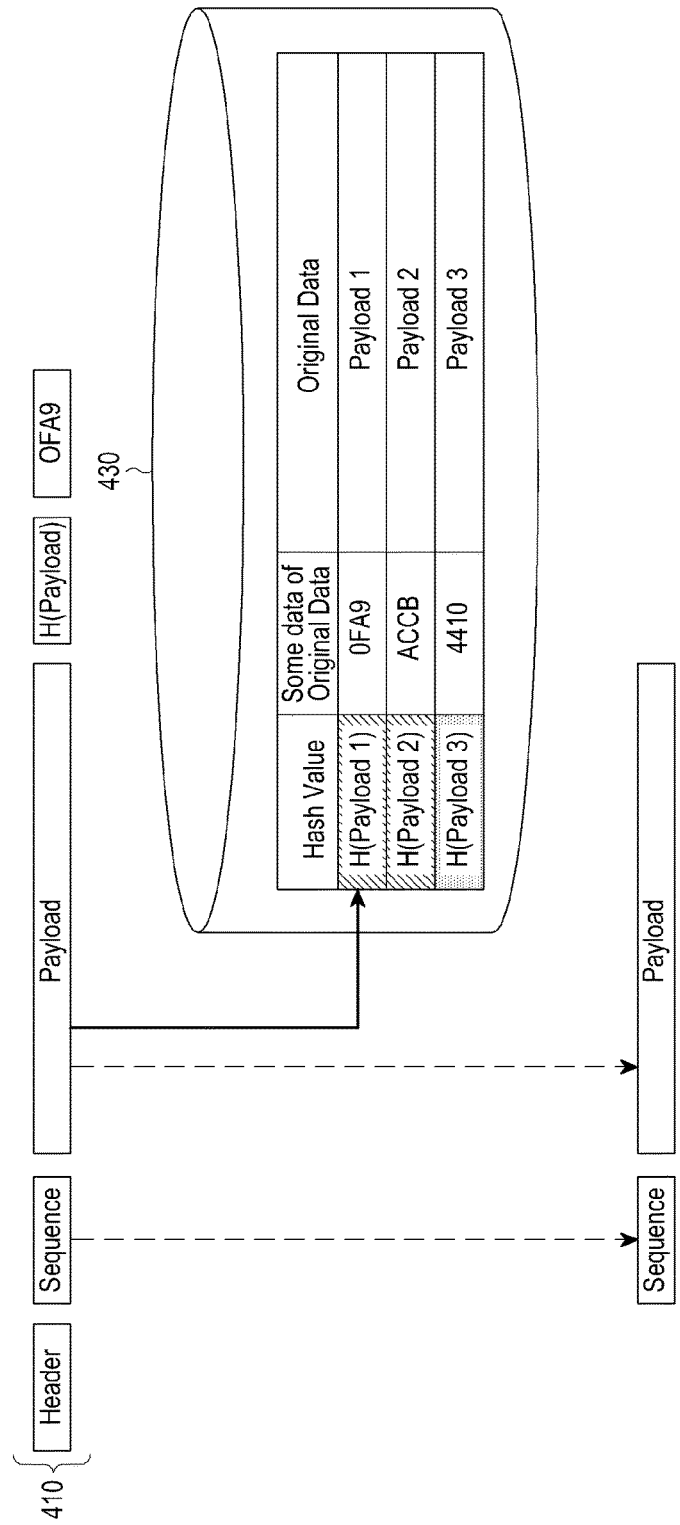
FIG. 4 is a diagram illustrating an example in which a reception entity of a communication system receives data according to an example embodiment of the present disclosure.

FIG. 4 is a diagram illustrating an example in which the reception entity receives data in the communication system according to an example embodiment of the present disclosure.

Referring to FIG. 4, the reception entity 150 receives a message 410 including a header, a sequence, a payload, a hash value, and some of the original data from the transmission entity 110. The reception entity 150 may identify the type of message received from the header included in the message 410. The reception entity 150 may identify, from the type of the received message, whether all the original data is included, and the type value of the message is predetermined between the transmission entity 110 and the reception entity 150. For example, when the type of the received message is the first type, the reception entity 150 may identify that all the original data is included in the received message. When the type of the received message is the second type, the reception entity 150 may identify that not all the original data is included in the received message.

When the received message is identified as the first type message from the header included in the received message, the reception entity 150 stores the hash value, some of the original data, and the original data included in the received message in the internal memory 430. Further, the reception entity 150 extracts the original data except for the header, the hash value, and some of the original data from the received message and identifies the original data. In addition, the reception entity 150 may transmit the identified original data to another processor or an application.

Figure 5:
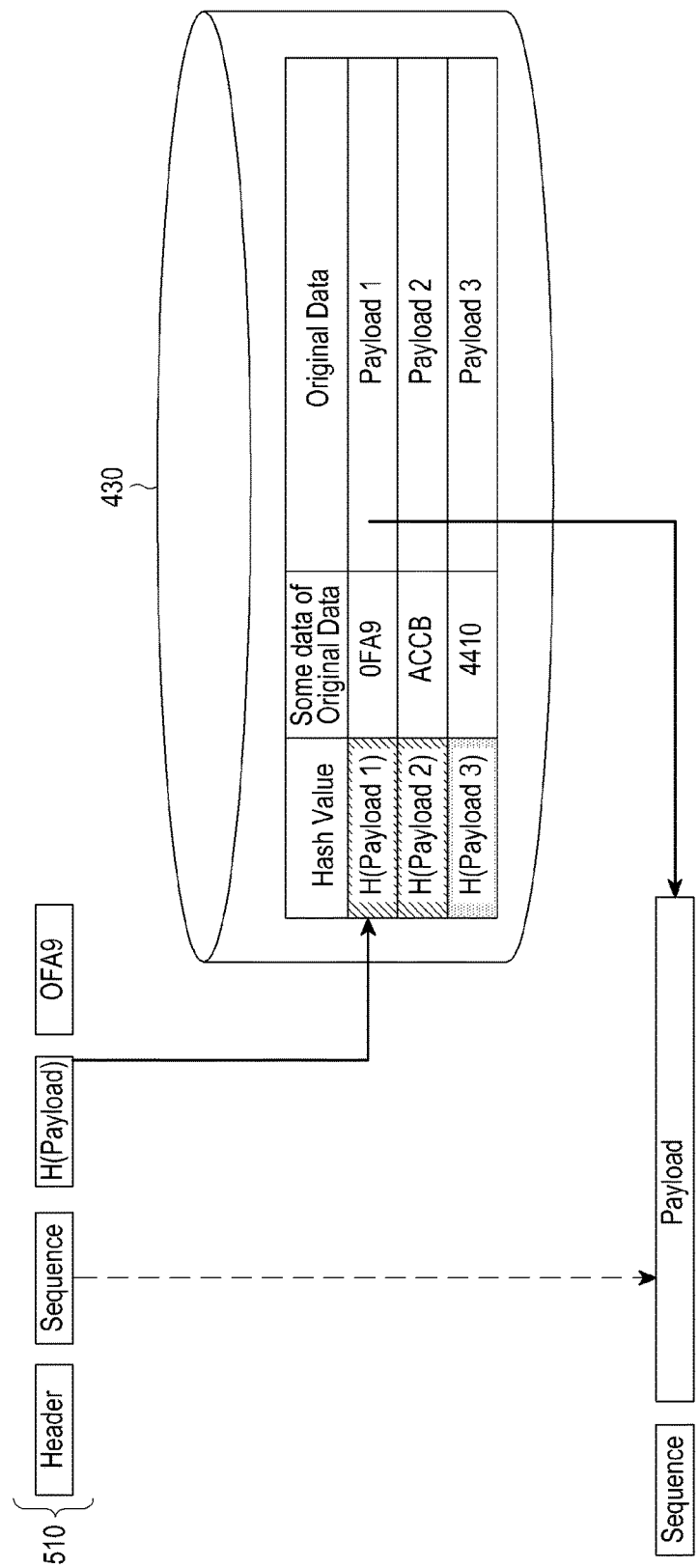
FIG. 5 is a diagram illustrating another example in which a reception entity of a communication system receives data according to an example embodiment of the present disclosure.

FIG. 5 is a diagram illustrating another detailed example in which the reception entity of the communication system receives data according to an example embodiment of the present disclosure.

Referring to FIG. 5, the reception entity 150 receives a message 510 including a header, a sequence, a hash value, and some of the original data from the transmission entity 110. Further, the reception entity 150 may identify the type of message received form the header included in the received message.

For example, when the received message is identified as the second type message from the header included in the received message, the reception entity 150 searches for whether there is a value which is the same as the hash value and some of the original data included in the received message in the internal memory 430. As a result, when there is the value which is the same as the hash value and some of the original data included in the received message in the internal memory 430, the reception entity 150 extracts the original data corresponding to the hash value and some of the original data from the internal memory 430 and identifies the original data. In addition, the reception entity 150 may transmit the identified original data to another processor or an application.

Figure 6:
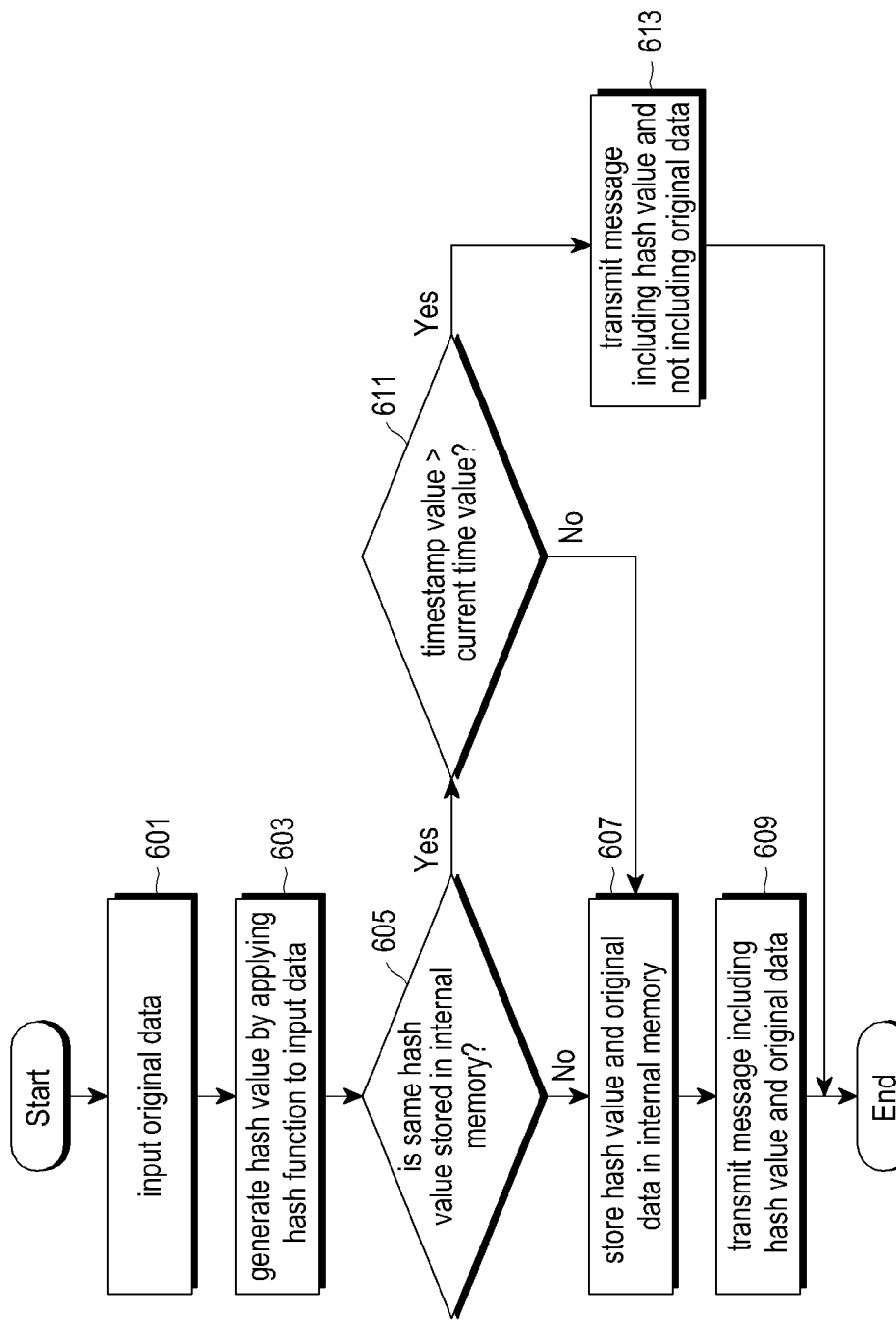
FIG. 6 is a flowchart illustrating an example method by which a transmission entity of a communication system transmits data according to an example embodiment of the present disclosure.

FIG. 6 is a flowchart illustrating an example method by which the transmission entity of the communication system transmits data according to an example embodiment of the present disclosure. The example embodiment of the present disclosure relates to an example in which a hash function is used for original data. In the example embodiment of FIG. 6, it is assumed that the transmission entity 110 determines to apply the hash function in advance and decides a type of the hash function in advance, but this is merely an example, and the disclosure is not limited thereto.

Referring to FIG. 6, when the transmission entity 110 receives original data through an input unit in step 601, the transmission entity 110 generates a hash value by applying the hash function to the input original data in step 603. Further, the transmission entity 110 identifies whether a hash value which is the same as the generated hash value is stored in the internal memory in step 605.

When the hash value which is the same as the generated hash value is not stored in the internal memory, the transmission entity 110 stores the generated hash value and original data in the internal memory in step 607, and generates a message including the generated hash value and the original data and transmits the message to the reception entity 150 in step 609. The message may further include at least one of a header including information on the type of the message and some of the original data.

On the other hand, when the hash value which is the same as the generated hash value is stored in the internal memory, the transmission entity 110 identifies whether a current time value or a count value exceeds a timestamp value of the hash value stored in the internal memory in step 611. When the current time value or the count value does not exceed the timestamp value, the transmission entity 110 generates a message that does not include the original data and includes the hash value and transmits the generated message to the reception entity 150 in step 613. Further, when the current time value or the count value exceeds the timestamp value, the transmission entity 110 proceeds to step 607.

For example, step 611 of the current time value or the count value is compared with the timestamp value of the hash value stored in the internal memory may correspond to an additional step in which the transmission entity 110 efficiently identifies whether the original data stored in the internal memory is effective original data, which may not be performed.

Figure 7:
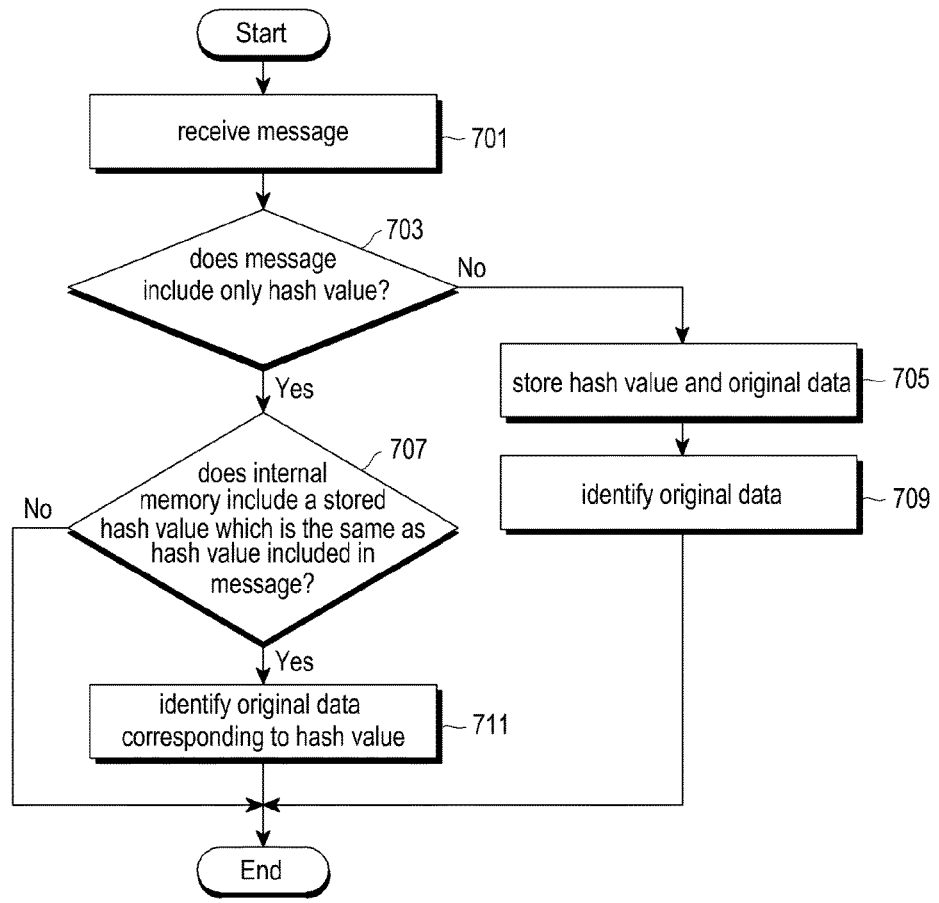
FIG. 7 is a flowchart illustrating an example method by which a reception entity of a communication system receives data according to an example embodiment of the present disclosure.

FIG. 7 is a flowchart illustrating an example method by which the reception entity of the communication system receives data according to an example embodiment of the present disclosure.

Referring to FIG. 7, the reception entity 150 receives a message from the transmission entity 110 in step 701. Further, the reception entity 150 identifies whether the received message includes only a hash value without original data in step 703. At this time, the reception entity 150 may identify whether only the hash value is included in the received message based on information on a message type included in a header of the received message. Further, the received message may further include some of the original data.

When the received message includes only the hash value, the reception entity 150 searches for whether there is a hash value which is the same as the hash value included in the received message in the internal memory in step 707.

When some of the original data is further included in the received message, the reception entity 150 may search for whether both the hash value and some of the original data exist, e.g., are stored, in the internal memory.

When there is the hash value which is the same as the hash value included in the received message, the reception entity 150 identifies original data corresponding to the hash value in the internal memory in step 711. On the other hand, when there is no hash value which is the same as the hash value included in the received message, the reception entity ends the data reception operation.

Further, when the received message does not include only the hash value (that is, when the received message includes both the hash value and the original data), the reception entity 150 stores the hash value and the original data included in the received message in the internal memory in step 705 and identifies the original data in step 709.

Additionally, when the communication system according to an example embodiment of the present disclosure is configured by a hierarchical network, the communication system may include a gateway that connects a plurality of transmission entities and one reception entity. An example of a case where the gateway is included in the communication system will be described with reference to FIG. 8.

Figure 8:
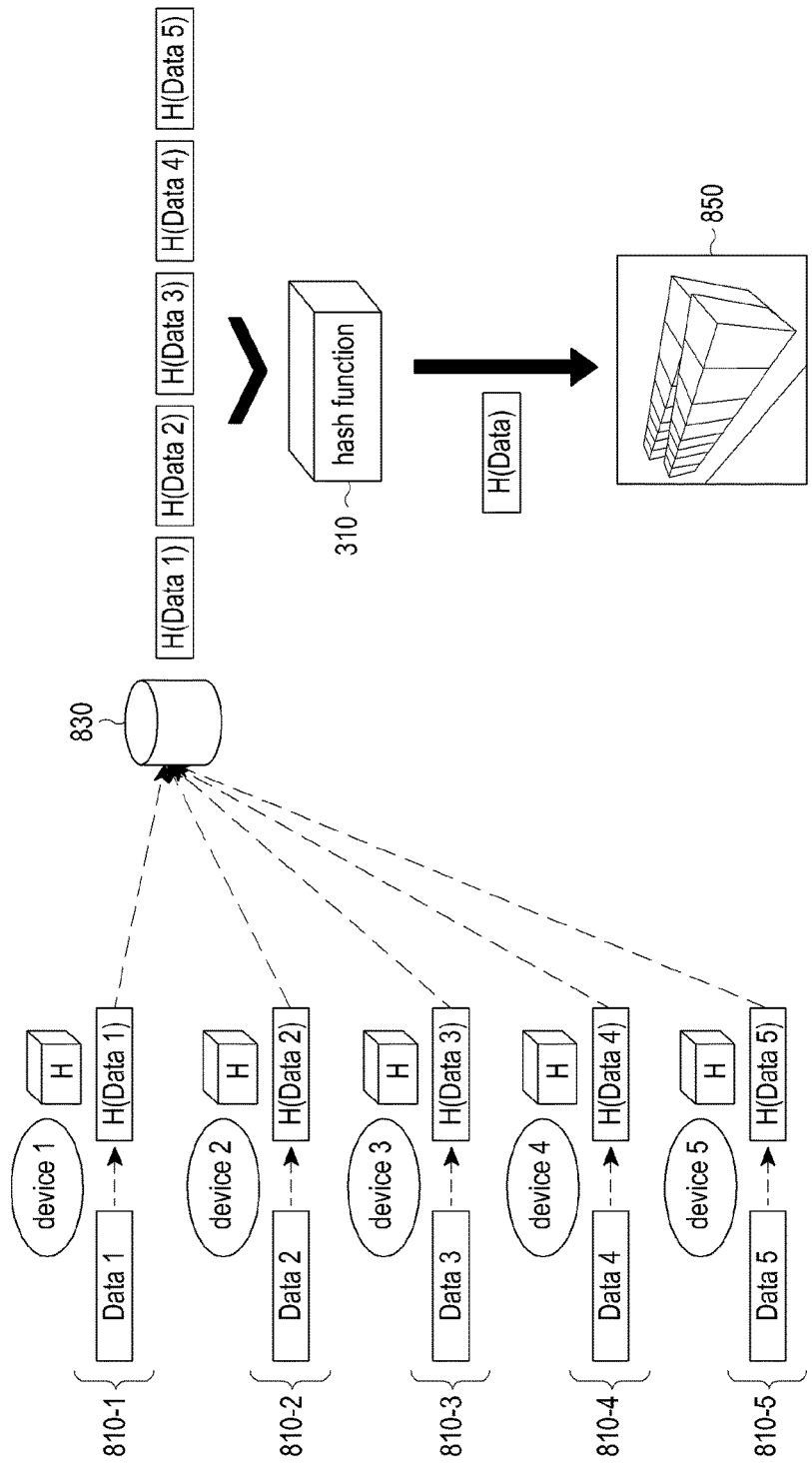
FIG. 8 is a diagram illustrating an example in which a gateway included in a communication system transmits and receives data according to an example embodiment of the present disclosure.

FIG. 8 is a diagram illustrating an example in which a gateway included in a communication system transmits and receives data according to an embodiment of the present disclosure. A gateway included in a communication system according to an example embodiment of the present disclosure may combine data received from one or more devices 810-1 to 810-5 and transmit the combined data to a server 850. For example, the gateway 830 performs the operation of the transmission entity 110 and the operation of the reception entity 150 described with reference to FIGS. 1 to 7. The gateway 830 may correspond to, for example, a hub. It is assumed in FIG. 8 that five devices 810-1 to 810-5 exist in the communication system.

Referring to FIG. 8, each of the devices 810-1 to 810-5 outputs a hash value by applying a hash function to original data to be transmitted to the gateway 830. Further, each of the devices 810-1 to 810-5 transmits at least one of the original data and the hash value to the gateway 830 based on whether the hash value exists in the internal memory.

The gateway 830 combines the hash values received from the devices 810-1 to 810-5 and generates a hash value by applying the hash function to the combined hash value. As the number of devices increases, the probability that the same data is received decreases, so that the gateway 830 generates a hash value by grouping devices having similar data change patterns. For example, the gateway 830 groups devices that have similar numbers of times data is generated based on accumulation of patterns of generated data and similar data transmission patterns and generate a hash value by applying the hash function to hash values received from the grouped devices. In another example, the gateway 830 groups devices in consideration of the number of devices to be grouped and a trade-off relationship between actually generated data transmission and generates a hash value by applying the hash function to hash values received from the grouped devices.

When the gateway 830 receives both the original data and the hash value from one of the devices 810-1 to 810-5, the gateway 830 stores the received original data and hash value in the internal memory. The gateway 830 stores the combined hash value and the generated hash value in the internal memory. The gateway 830 transmits at least one of the original data, the combined hash value, and the generated hash value to the server 850 based on whether the generated hash value exists in the internal memory. For example, when the generated hash value exists in the internal memory, the gateway 830 transmits only the generated hash value to the server 850. When the generated hash value does not exist in the internal memory, the gateway 830 transmits the original data, the combined hash value, and the generated hash value to the server 850.

Figure 9:
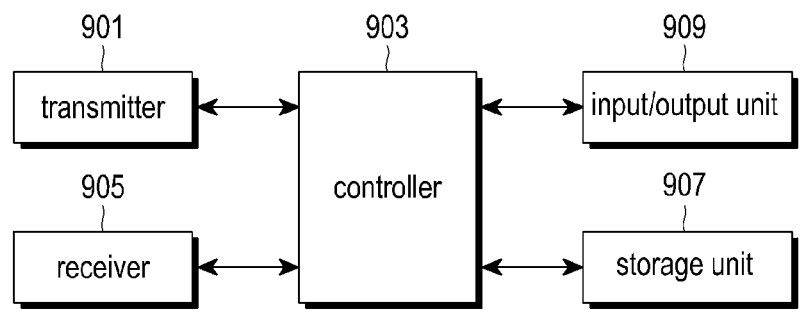
FIG. 9 is a block diagram illustrating an example of an internal structure of a transmission entity that transmits data in a communication system according to an example embodiment of the present disclosure.

FIG. 9 is a block diagram illustrating an example of an internal structure of the transmission entity that transmits data in a communication system according to an example embodiment of the present disclosure.

Referring to FIG. 9, the transmission entity 110 includes a transmitter 901, a receiver 905, a controller 903, a storage unit 907, and an input/output unit (e.g., including input/output circuitry) 909.

The controller 903 controls the general operation of the transmission entity 110 and, for example, controls an operation related to a data transmission operation performed in the communication system according to an example embodiment of the present disclosure. Since the operation relation to the data transmission operation performed in the communication system according to an example embodiment of the present disclosure is the same as or similar to that described in FIGS. 1 to 3 and FIGS. 6 and 8, a detailed description thereof will be omitted herein.

The transmitter 901 transmits various signals and various messages to other entities included in the communication system, for example, other entities such as a gateway and a server under control of the controller 903. Since the various signals and the various messages transmitted by the transmitter 901 are the same as or similar to those described in FIGS. 1 to 3 and FIGS. 6 and 8, a detailed description thereof will be omitted herein.

The receiver 905 receives various signals and various messages from other entities included in the communication system, for example, other entities such as a gateway and a server according to a control of the controller 903. Since the various signals and the various messages received by the receiver 905 are the same as or similar to those described in FIGS. 1 to 3 and FIGS. 6 and 8, a detailed description thereof will be omitted herein.

The storage unit 907 stores a program and data on the operation related to the data transmission operation performed in the communication system according to an example embodiment of the present disclosure under control of the controller 903. Further, the storage unit 907 stores various signals and various messages received from the other entities by the receiver 905. For example, the storage unit 907 stores original data to be transmitted and a hash value for the original data.

The input/output unit 909 may include various input/output circuitry configured to output various signals and various messages associated with the operation related to the data transmission operation performed in the communication system according to an example embodiment of the present disclosure by the transmission entity 110 under control of the controller 903.

Although FIG. 9 illustrates that the transmitter 901, the receiver 905, the controller 903, the storage unit 907, and the input/output unit 909 are implemented as separate units, the transmission entity 110 may be implemented in the form of a combination of two or more of the transmitter 901, the receiver 905, the controller 903, the storage unit 907, and the input/output unit 909. Further, the transmission entity 110 may be implemented as one processor.

Figure 10:
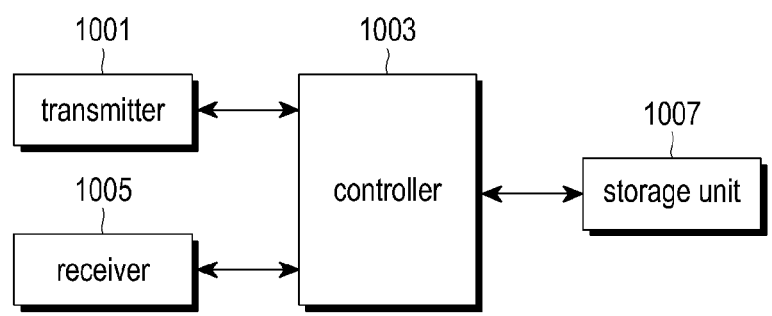
FIG. 10 is a block diagram illustrating an example of an internal structure of a reception entity that receives data in a communication system according to an example embodiment of the present disclosure.

FIG. 10 is a block diagram illustrating an example of an internal structure of the reception entity that receives data in a communication system according to an example embodiment of the present disclosure.

Referring to FIG. 10, the reception entity 150 includes a transmitter 1001, a receiver 1005, a controller 1003, and a storage unit 1007.

The controller 1003 controls general operations of the reception entity 150 and, for example, controls an operation related to a data reception operation performed in a communication system according to an example embodiment of the present disclosure. Since the operation related to the data reception operation performed in the communication system according to an example embodiment of the present disclosure is the same as or similar to that described in FIGS. 1, 2, 4, 5, 7, and 8, a detailed description thereof will be omitted herein.

The transmitter 1001 transmits various signals and various messages to other entities included in the communication system, for example, other entities such as a terminal under control of the controller 1003. Since the various signals and the various messages transmitted by the transmitter 1001 are the same as or similar to those described in FIGS. 1, 2, 4, 5, 7, and 8, a detailed description thereof will be omitted herein.

Further, the receiver 1005 receives various signals and various messages from other entities included in the communication system, for example, other entities such as a terminal under control of the controller 1003. Since the various signals and the various messages received by the receiver 1005 are the same as or similar to those described in FIGS. 1, 2, 4, 5, 7, and 8, a detailed description thereof will be omitted herein.

The storage unit 1007 stores a program and data on the operation related to the data reception operation performed in the communication system according to an embodiment of the present disclosure under control of the controller 1003. Further, the storage unit 1007 stores various signals and various messages received from the other entities by the receiver 1005. Particularly, the storage unit 1007 stores original data to be transmitted and a hash value for the original data.

Although FIG. 10 illustrates that the transmitter 1001, the receiver 1005, the controller 1003, and the storage unit 1007 are implemented as separate units, the reception entity 150 may be implemented in the form of a combination of two or more of the transmitter 1001, the receiver 1005, the controller 1003, and the storage unit 1007. Further, the reception entity 150 may be implemented as one processor.

Figure 11:
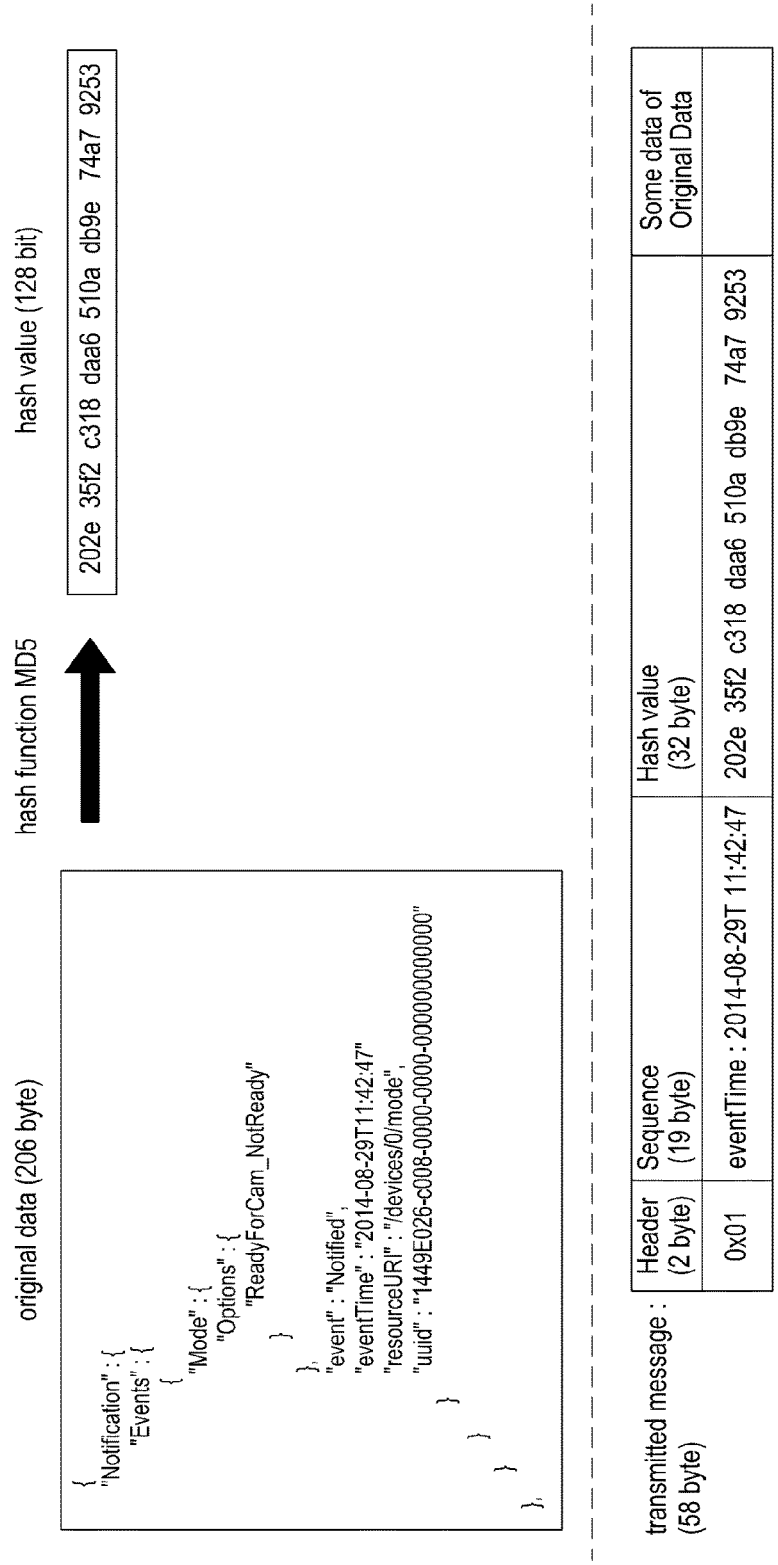
FIG. 11 is a diagram illustrating an example of efficiency of data transmission by a transmission entity in a communication system according to an example embodiment of the present disclosure.

FIG. 11 is a diagram illustrating an example of efficiency of data transmission by the transmission entity in a communication system according to an example embodiment of the present disclosure.

Referring to FIG. 11, the transmission entity 110 may output a hash value of 128 bits (that is, 32 bytes) by applying a hash function MD5 to original data of 206 bytes. Accordingly, when configuring a message transmitted to the reception entity 150, the transmission entity 110 may insert a header, a sequence, a hash value, and original data in the message and configure a message of 56 bytes. Accordingly, when transmitting the same data, the transmission entity 110 may transmit a message which is only 28% of the size of the original data (that is, transmitted message (58 bytes)/original data (206 bytes)*100) to the reception entity 150, thereby efficiently using the network.

Figure 12:
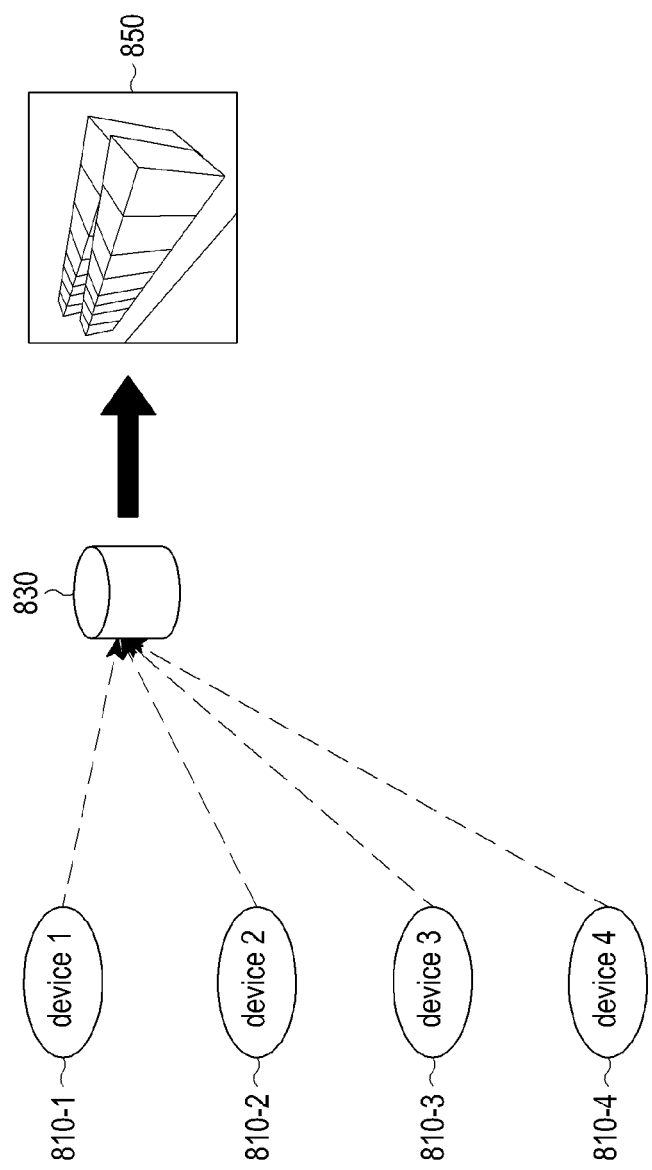

FIGS. 12, 13A and 13B are diagrams illustrating another example of efficiency of data transmission by the transmission entity in a communication system according to an example embodiment of the present disclosure. Transmission efficiency of the case where the transmission entity 110 includes the plurality of devices 810-1 to 810-4 and the gateway 830 will be described with reference to FIGS. 12 and 13.

Each of the plurality of devices 810-1 to 810-4 illustrated in FIG. 12 repeatedly transmits, for example, three types of data 100 bytes, 90 bytes, and 80 bytes and, when the hash value generated by the gateway 830 corresponds to 20 bytes, the gateway 830 may transmit data with the transmission efficiency illustrated in FIG. 13.

For example, referring to FIGS. 13A and 13B, original data which each of the plurality of devices 810-1 to 810-4 transmits to the gateway 830 corresponds to 1800 bytes, but amount of data actually transmitted corresponds to 670 bytes, so that each of the plurality of devices 810-1 to 810-4 according to an embodiment of the present disclosure may reduce the data by 28.552% and transmit the reduced data to the gateway 830. Further, data which the gateway 830 transmits to the server 850 correspond to 2680 bytes, but the amount of actually transmitted data corresponds to 2050 bytes, so that the gateway 830 according to an example embodiment of the present disclosure may reduce the data by 76.493% and transmit the reduced data to the server 850, and each of the plurality of devices 810-1 to 810-4 may reduce the data by 21% and transmit the reduced data to the server 850. Since it is assumed that such a data transmission efficiency is obtained when the original data corresponds to 100 bytes, 90 bytes, and 80 bytes, a better data transmission efficiency may be expected as the size of the original data becomes larger or the number of layers becomes larger.

Although the various example embodiments have been described in the description of the present disclosure, the present disclosure may be modified in various forms without departing from the scope of the present disclosure. Thus, the scope of the present disclosure shall not be determined merely based on the described example embodiments but rather determined based on the accompanying claims and the equivalents thereto.

What is claimed is:

1. A method of transmitting data from a first device to a second device in a communication system, the method comprising:
   generating a hash value by applying a hash function to original data;
   generating a message including at least one of:
   the original data and
   the generated hash value,
   based on whether there is an existing hash value stored in a memory of the first device, equal to the generated hash value, and whether a current time value exceeds a first timestamp value related to an effective time for the existing hash value, wherein the first timestamp value is stored in the memory; and
   transmitting, to the second device, the message.

2. The method of claim 1, wherein the generating of the message comprises:
   identifying whether there is an existing hash value equal to the generated hash value and there is a part of an existing original data equal to a part of the original data; and
   generating a message including the generated hash value and the part of the original data, and not including the original data, if there is the existing hash value and there is part of the existing original data.

3. The method of claim 1, wherein the generating of the message comprises:
   identifying whether there is an existing hash value equal to the generated hash value and the current time value exceeds the first timestamp value related to the effective time of the existing hash value; and
   generating a message that does not include the original data and includes the generated hash value, if there is the existing hash value and the current time value does not exceed the first timestamp value related to the effective time of the existing hash value when there is no existing hash value or the current time value or the count value.

4. The method of claim 2, wherein the the type of the hash function is determined based on a generation frequency of the original data, and a length of the generated hash value is shorter than a length of the original data.

5. The method of claim 2, further comprising:
   generating a message including the original data and the generated hash value and storing the original data, the part of the original data and the generated hash value, if there is no existing hash value or there is not the part of the existing original data.

6. The method of claim 3, further comprising:
   generating a message including the original data, the generated hash value, and storing the original data, the generated hash value, and a second timestamp value related to the current time value for the generated hash value, if there is no existing hash value or the current time value exceeds the first timestamp value.

7. A method of receiving data from a first device to a second device in a communication system, the method comprising:
   receiving, from the first device, a message including at least one of:
   original data, and
   a hash value;
   identifying whether the message includes both the original data and the hash value, and whether a current time value exceeds a first timestamp value related to an effective time for the existing hash value, wherein the first timestamp value is stored in a database of the second device; and
   identifying existing original data corresponding to the hash value if the message includes the hash value and does not include the original data and the current time value does not exceed the first timestamp value related to the effective time for the existing hash value.

8. The method of claim 7, further comprising:
   identifying whether there is an existing hash value equal to the hash value and whether there is part of an existing original data equal to a part of the original data; and
   identifying the existing original data corresponding to the hash value and the part of the original data if there is the existing hash value equal to the hash value and there is the part of the existing original data.

9. The method of claim 7, wherein a length of the hash value is shorter than a length of the original data.

10. The method of claim 7, further comprising:
    storing the original data, the hash value and a second timestamp value related to the current time value, and identifying the original data, if the message includes both the original data and the hash value or the current time value exceeds the first timestamp value related to the effective time for the existing hash value.

11. The method of claim 8, further comprising:
    storing the original data and the hash value, and identifying the original data if there is no existing hash value or there is not the part of an existing original data.

12. A method of transmitting and receiving data by a gateway in a communication system, the method comprising:
    receiving first hash values from a plurality of first devices;
    generating a second hash value by applying a hash function to the received first hash values;
    generating a message including at least one of the received first hash values or the generated second hash value based on whether there is an existing hash value in a memory, equal to the generated second hash value; and transmitting, to a second device, the message, wherein the generating of the message comprises:

identifying whether there is an existing hash value equal to the generated second hash value; and if there is no existing hash value, generating a message including both the received first hash values and the generated second hash value.

13. The method of claim 12, further comprising managing original data for each of the plurality of first devices and the hash value and managing the first hash values for the plurality of first devices and the generated second hash value, wherein the plurality of first devices have numbers of times data is generated falling within a predetermined range and similar data transmission patterns.

14. The method of claim 12, wherein the generating of the message further comprises:

if there is the existing hash value, generating a message including the generated second hash value and not including the received first hash values.

15. A first device for transmitting data to a second device in a communication system, the first device comprising:

a controller configured to:
generate a hash value by applying a hash function to original data, and
generate a message including at least one of:
the original data and
the generated hash value based on whether there is an existing hash value stored in a memory of the first device, equal to the generated hash value and whether a current time value exceeds a first timestamp value related to an effective time for the existing hash value, wherein the first timestamp value is stored in the memory; and a transmitter configured to transmit, to the second device, the message.

16. The apparatus of claim 15, wherein the controller is configured to:

identify whether there is an existing hash value equal to the generated hash value and there is a part of an existing original data equal to a part of the original data, and generate a message including the generated hash value and the part of the original data, and not including the original data, if there is the existing hash value equal to the generated hash value and there is the part of an existing original data.

17. The first device of claim 15, wherein the controller is configured to:

identify whether there is an existing hash value equal to the generated hash value and whether the current time value exceeds the first timestamp value related to the effective time of the existing hash value; and generate a message that does not include the original data and includes the generated hash value if there is the exiting hash value equal to the generated hash value and the current time value does not exceed the first timestamp value related to the effective time of the existing hash value.

18. The first device of claim 16, wherein the type of the hash function is determined based on a generation frequency of the original data, and a length of the generated hash value is shorter than a length of the original data.

19. The first device of claim 16, wherein the controller is configured to:

generate a message including the original data and the generated hash value, and store the original data, the part of the original data and the generated hash value if there is no existing hash value or there is not the part of the existing original data.

20. The first device of claim 17, wherein the controller is configured to:

generate a message including the original data, the generated hash value, and to store the original data, the generated hash value, and a second timestamp value related to the current time value for the generated hash value if there is no existing hash value or the current time value exceeds the first timestamp value.

21. A second device for receiving data from a first device in a communication system, the second device comprising:

a receiver configured to receive, from the first device, a message including at least one of:
original data; and
a hash value; and a controller configured:
identify whether the message includes both the original data and the hash value, and whether a current time value exceeds a first timestamp value related to an effective time for the existing hash value, wherein the first timestamp value is stored in a database of the second device; and
identify existing original data corresponding to the hash value if the message includes the hash value and does not include the original data, and the current time value does not exceed the first timestamp value related to the effective time for the existing hash value.

22. The apparatus of claim 21, wherein the controller is configured to:

identify whether there is an existing hash value equal to the hash value and whether there is part of an existing original data equal to a part of the original data; and identify the existing original data corresponding to the hash value and the part of the original data if there is the existing hash value equal to the hash value and there is the part of the existing original data.

23. The second device of claim 21, wherein a length of the hash value is shorter than a length of the original data.

24. The second device of claim 21,
wherein the controller further configured to:
store the original data, the hash value and a second timestamp value related to the current time value and identify the original data if the message includes both the original data and the hash value or the current time value exceeds the first timestamp value related to the effective time for the existing hash value.

25. The second device of claim 22,
wherein the controller further configured to:
store the original data and the hash value and to identify the original data if there is no existing hash value or there is not the part of an existing original data.

26. A gateway for transmitting and receiving data in a communication system, the gateway comprising:

a receiver configured to receive first hash values from a plurality of first devices;

a controller configured to generate one hash value by applying a hash function to the received first hash values and to generate a message including at least one of the received first hash values or the generated second hash value based on whether there is an existing hash value stored in a memory equal to the generated second hash value; and a transmitter configured to transmit, to a second device, the message, wherein the controller is further configured to generate a message including both the received first hash values and the generated second hash value if there is no existing hash value.

27. The gateway of claim 26, wherein the plurality of first devices have numbers of times data is generated within a predetermined range, and similar data transmission patterns.

28. The gateway of claim 26, wherein the controller is further configured to manage original data for each of the plurality of first devices and the second hash value, to manage the first hash values for the plurality of first devices and the generated second hash value, and to generate a message including only the generated second hash value when there is the existing hash value equal to the generated hash value.

\* \* \* \* \*